United States Patent [19]

Winston et al.

[11] Patent Number: 5,261,967
[45] Date of Patent: Nov. 16, 1993

[54] POWDERED ELECTRIC CIRCUIT ASSEMBLY CLEANER

[75] Inventors: Anthony E. Winston, East Brunswick, N.J.; Keith A. Jones, Yardley, Pa.; Francis R. Cala, Highland Park, N.J.; Alfredo Vinci, Dayton, N.J.; M. Stephen Lajoie, Basking Ridge, N.J.

[73] Assignee: Church & Dwight Co, Inc., Princeton, N.J.

[21] Appl. No.: 896,409

[22] Filed: Jun. 10, 1992

Related U.S. Application Data

[63] Continuation-in-part of Ser. No. 731,512, Jul. 17, 1991, abandoned.

[51] Int. Cl.$^5$ ............................................. B08B 3/04
[52] U.S. Cl. ..................................... 134/42; 134/2; 134/40; 252/135
[58] Field of Search ............................ 134/2, 40, 42

[56] References Cited

U.S. PATENT DOCUMENTS

| | | | |
|---|---|---|---|
| 2,739,129 | 3/1956 | Manchot | 252/89 |
| 2,741,599 | 4/1956 | McDonald et al. | 252/138 |
| 3,023,132 | 2/1962 | Diamond et al. | 134/10 |
| 3,672,993 | 6/1972 | Mitchell et al. | 134/3 |
| 3,847,663 | 11/1974 | Shumaker | 134/2 |
| 3,904,685 | 9/1975 | Shahidi et al. | 260/537 |
| 4,089,703 | 5/1978 | White | 134/22 |
| 4,214,915 | 7/1980 | Dillarstone et al. | 134/19 |
| 4,228,048 | 10/1980 | Tesdahl | 260/17.4 |
| 4,283,299 | 8/1981 | Becker et al. | 252/90 |
| 4,304,680 | 12/1981 | Wixon | 252/114 |
| 4,347,152 | 8/1982 | Wixon | 252/174 |
| 4,348,292 | 9/1982 | Ginn | 252/90 |
| 4,362,640 | 12/1982 | Schreiber | 252/135 |
| 4,382,825 | 5/1983 | McCready | 134/2 |
| 4,434,069 | 2/1984 | Fairchild | 252/174 |
| 4,457,322 | 7/1984 | Rubin et al. | 134/2 |
| 4,521,332 | 6/1985 | Milora | 252/527 |
| 4,528,039 | 7/1985 | Rubin et al. | 134/2 |
| 4,539,133 | 9/1985 | Boskamp | 252/109 |
| 4,554,026 | 11/1985 | Cosper et al. | 134/38 |
| 4,741,863 | 5/1988 | Yamamoto et al. | 252/547 |
| 4,756,846 | 7/1988 | Matsuura et al. | 252/156 |
| 4,783,281 | 11/1988 | Bishop et al. | 252/135 |
| 4,820,440 | 4/1989 | Hemm et al. | 252/135 |
| 4,820,441 | 4/1989 | Evans et al. | 252/174.18 |
| 4,844,744 | 7/1989 | Leiter et al. | 134/40 |
| 4,869,844 | 9/1989 | Johnson | 252/159 |
| 4,904,571 | 2/1990 | Miyashita et al. | 430/331 |
| 5,015,408 | 5/1991 | Reuss | 252/99 |
| 5,049,200 | 9/1991 | Brunner et al. | 134/2 |
| 5,096,609 | 5/1992 | Dany et al. | 252/135 |
| 5,108,641 | 4/1992 | Ahmed et al. | 252/94 |

*Primary Examiner*—Patrick P. Garvin
*Attorney, Agent, or Firm*—Charles B. Barris

[57] ABSTRACT

A method of removing rosin soldering flux or other residues from a printed wiring board comprises directly adding to the wash water which contacts the boards a powdered cleaning composition which comprises water soluble alkaline salts. The method of directly adding the cleaning composition to the water supply in the form of a powder eliminates the need to incorporate organic stabilizers which previously have been required to maintain surfactants and the like in solution in aqueous concentrates. By reducing the organic content of the cleaning compositions, the aqueous effluents from the cleaning method have substantially reduced biological oxygen demand (BOD) and chemical oxygen demand (COD) levels.

29 Claims, No Drawings

POWDERED ELECTRIC CIRCUIT ASSEMBLY CLEANER

This application is a continuation-in-part of U.S. Ser. No. 07/731,512 filed Jul. 17, 1991 and now abandoned.

FIELD OF THE INVENTION

The present invention relates to environmentally safe powdered flux removing compositions which are added directly to and dissolved in aqueous media for cleaning electronic circuit assemblies, such as printed circuit or printed wiring boards, during the fabrication thereof. Alkaline salts are utilized, optionally with a corrosion inhibitor, antifoam agents and other optional adjuvants such as surfactants to achieve a variety of objectives, among which are the removal of solder flux, oils, waxes, greasy substances, adhesive and other residues. A particular advantage of the powdered product is the extremely low BODs and CODs imparted to the water effluent.

BACKGROUND OF THE INVENTION

The cleanliness of electronic circuit assemblies (ECA), such as printed circuit boards (PCB) or printed wiring boards (PWB), is generally regarded as being critical to their functional reliability. Ionic and nonionic contamination on circuit assemblies is believed to contribute to premature failures of the circuit assemblies by allowing short circuits to develop.

In the manufacture of electronic circuit assemblies, ionic and nonionic contamination can accumulate after one or more steps of the process. Circuit assembly materials are plated, etched, handled by operators in assembly, coated with corrosive or potentially corrosive fluxes and finally soldered.

In the fabrication of electronic circuit assemblies, e.g., printed circuit boards, soldering fluxes are first applied to the substrate board material to ensure firm, uniform bonding of the solder. These soldering fluxes fall into two broad categories: rosin and non-rosin, or water soluble, fluxes. The rosin fluxes, which are generally only moderately corrosive and have a much longer history of use, are still widely used throughout the electronics industry. The water soluble fluxes, which are a more recent development, are being used increasingly in consumer products applications. However, the water soluble fluxes contain strong acids and/or amine hydrohalides, such fluxes are very corrosive. Unfortunately, residues of any flux can cause circuit failure if residual traces of the material are not carefully removed from the boards following soldering.

While water soluble fluxes can be easily removed with warm, soapy water, the removal of rosin flux from printed circuit boards is more difficult and has therefore traditionally been carried out with the use of chlorinated hydrocarbon solvents such as 1,1,1,-trichlorethane, trichloroethylene, trichloromonofluoromethane, methylene chloride, trichlorotrifluoroethane (CFC113), tetrachlorodifluoroethane (CFC112) or mixtures or azeotropes of these and/or other solvents. These solvents are undesirable, however, because they are toxic and when released into the environment deplete the ozone layer and/or contribute to the greenhouse global warming effect. Thus, use of such solvents is subject to close scrutiny by the Occupational Safety and Health Administration (OSHA) and the Environmental Protection Agency (EPA) and stringent containment equipment must be used. Moreover, if released into the environment these solvents are not readily biodegradable and are thus hazardous for long periods of time.

In view of the toxicity of such solvents and, in view of recent concerns regarding the release of chlorofluorocarbons into the environment, the use of such solvents is being heavily regulated and phased out such that alternatives to such solvents are in immediate need.

Alkaline cleaning compounds known as the alkanolamines, usually in the form of monoethanolamine, have been used for rosin flux removal as an alternative to the toxic chlorinated hydrocarbon solvents. These high pH compounds (e.g., about 12 pH), chemically react with rosin flux to form a rosin soap through the process of saponification. Other organic substances such as surfactants or alcohol derivatives may be added to these alkaline cleaning compounds to facilitate the removal of such rosin soap. Unfortunately, these high pH compounds, like the water soluble soldering fluxes, have a tendency to cause corrosion on the surfaces and interfaces of printed wiring boards if they are not completely and rapidly removed during the fabrication process. Additionally, these cleaning compounds provide high levels of organics to the wash bath. Thus, the water effluents obtained during the cleaning process must be treated to bring the COD and BOD to acceptable levels before disposal.

In other approaches, Daley et al., U.S. Pat. No. 4,635,666 utilize a highly caustic solution having a pH of 13 in a batch cleaning process. This method severely oxidizes the solder applied to the circuit board. In Hayes et al., U.S. Pat. Nos. 4,640,719 and 4,740,247 rosin soldering flux and other residues are removed from electronic assemblies by means of terpene compounds in combination with terpene emulsifying surfactants by rinsing in water.

The complete removal of adhesive and other residues also poses a problem. During the manufacture of electronic circuit assemblies the components are mounted on the upper surface of the board with leads protruding downwardly through holes in the board and are secured to the bottom surface of the board by means of an adhesive. Further, it is sometimes necessary to temporarily protect certain portions of the board from processing steps such as the process of creating corrosion resistant gold connecting tabs at the board edges. This transient protection of portions of the circuit board can be achieved by the application of special adhesive tape to susceptible areas. Once such protection is no longer needed, the adhesive tape must be removed. In both instances, a residue of adhesive generally remains which, if not thoroughly removed, can cause premature board failure. Removal of this adhesive residue has traditionally been carried out by the use of chlorinated solvents which, as already described, are toxic and environmentally undesirable.

Thus, the residual contaminants which are likely to be found on electronic circuit assemblies and which can be removed by the compositions and method of the present invention include, but are not limited to, for example, rosin flux, photoresist, solder masks, adhesives, machine oils, greases, silicones, lanolin, mold release, polyglycols and plasticizers.

In copending, commonly assigned U.S. Ser. No. 731,512, filed Jul. 17, 1991, an improved cleaning composition characterized by non-corrosiveness and low environmental impact, unlike the prior art chlorinated hydrocarbon solvents and alkaline cleaners, are employed for cleaning printed wire board and printed circuit boards. As disclosed therein, the cleaning compositions comprise alkali metal carbonate and bicarbonate salts so combined that during use at the desired concentration of these salts, the pH of the wash solution ranges from about 10 to 12, typically substantially less than 12 and even less than pH 11. Such cleaners are very effective in removing all the flux and other residues from the circuit and wiring boards. Moreover, since the carbonate and bicarbonate salts are nontoxic and are very compatible with the environment, the use of the cleaning compositions disclosed in the above-mentioned application represent a substantial improvement in the art.

The marketplace has become readily accustomed to and therefor have demanded that the above-described cleaning composition and other cleaning compositions be provided in the form of aqueous concentrates which are added to the wash water during the cleaning process. Unfortunately, by providing cleaning compositions in the form of aqueous concentrates, organic stabilizers are required to maintain certain adjuvants such as anticorrosion agents and surfactants in aqueous solution in the concentrate during handling and storage and the like. These additional organics in the aqueous concentrate add to the BOD and COD levels of the water effluents from the washing process. It would be very advantageous to remove this minimal although still present environmental burden from these aqueous cleaning compositions used for cleaning the electronic circuit assemblies as described above.

SUMMARY OF THE INVENTION

It is an object of the present invention to provide compositions and methods for the safe and effective removal of rosin soldering fluxes from electronic circuit assemblies, e.g., printed circuit boards, without otherwise adversely affecting the boards. It is a further objective of this invention to provide safe and effective compositions and methods for the removal of other residual contaminants from printed circuit assemblies.

Another important objective of the present invention is to provide an effective cleaning composition and method for the safe and effective removal of rosin soldering fluxes from electronic circuit assemblies and which impart the barest minimum levels of organics to the wash water.

This invention provides cleaning compositions and methods for the removal of rosin solder fluxes and other residues during the fabrication of printed circuit or wiring boards. As a result, the possibility of premature circuit failure that might occur in the absence of such cleaning is eliminated or greatly reduced. The cleaning efficacy of the compositions of the invention is such that printed wiring boards thus treated meet stringent U.S. Department of Defense specifications.

The compositions of the invention are characterized by non-corrosiveness and very low environmental impact, unlike the chlorinated hydrocarbon solvents and highly alkaline cleaners that have heretofore been employed for printed wiring board and printed circuit board cleaning. Advantageously, the flux removing compositions, as used herein, exhibit very low biological oxygen demands (BOD) and chemical oxygen demands (COD) and may even allow discharge of water effluents to the sewer without further treatment.

The present invention provides powdered printed circuit/wiring board cleaning compositions comprising water soluble alkaline salts so combined that they yield, when used in concentrations of about 0.1 to 15 percent by weight in water, a pH of from about 10 to 13, preferably, from 10 to less than 12. It is desirable for effective cleaning that the composition be in amounts at the dilution of the wash bath to provide an adequate reserve of titratable alkalinity, at least equivalent to from about 0.2 to 4.5 percent caustic potash (potassium hydroxide), when titrated to the colorless phenolphthalein end point, which is about pH 8.4. The cleaning compositions of this invention are used by adding the powdered cleaner directly into the wash bath.

The powdered flux removing compositions also preferably contain a corrosion inhibitor to provide corrosion protection for the metal surfaces being cleaned. The powdered flux removing compositions may also contain a small amount of an antifoam agent or a surfactant with foam reducing properties, wetting agents, surfactants, and emulsifiers. These adjuvants can be included with the powdered salts per se such as by coating the powders or these adjuvants may be added separately to the aqueous wash bath. Since the cleaning composition is provided in powdered form, there is no need to include hydrotropes or other organic stabilizers to maintain surfactants, corrosion inhibitors, and other adjuvants in solution such as needed in aqueous concentrate packages. Accordingly, the powdered compositions of this invention yield reduced BOD and COD levels in the aqueous effluents from the cleaning process.

Moreover, when used according to the above, the compositions do not leave an undesirable residual film and are effective in removing the fluxes and other residues from electronic circuit boards.

DETAILED DESCRIPTION OF THE INVENTION

The objects and advantages mentioned above as well as other objects and advantages may be achieved by the compositions and methods hereinafter described.

Essentially, the powdered flux removing compositions of the invention comprise mixtures of alkali metal salts which form the bulk of the cleaners. Adjuvants, such as, corrosion inhibitors, antifoam agents and surfactants are preferably added to enhance performance of the cleaning composition. Accordingly, the term "flux removing compositions" as used herein is intended to define the mixture of active ingredients comprised of the alkali metal salts and, preferably, corrosion inhibitors, antifoam agents, surfactants and any other adjuvants as hereinlater described.

As used herein the terms "flux removing solutions" or "flux removing solutions in use" is meant to define aqueous mixtures of from about 0.1 to 15 percent by weight of the flux removing composition with the balance comprised essentially of water which are employed in the cleaning methods of the invention.

In accordance with the invention, additives, adjuvants, or the like, may be included with the flux removing compositions and form part of the powdered compositions or the flux removing solutions in use.

The flux removing compositions of the present invention contain at least one alkaline salt, and, preferably, will contain mixtures of different alkaline salts which are water soluble. Suitable alkaline salts or mixtures thereof for the invention are those capable of providing the desired pH when in aqueous solution. Most suitable are the alkaline salts of potassium or sodium with potassium being preferred. Especially preferred are the carbonates and bicarbonates and mixtures thereof which are economical, safe and environmentally friendly. The carbonate salts include potassium carbonate, potassium carbonate dihydrate, and potassium carbonate trihydrate, sodium carbonate, sodium carbonate decahydrate, sodium carbonate heptahydrate, sodium carbonate monohydrate, sodium sesquicarbonate and the double salts and mixtures thereof. The bicarbonate salts include potassium bicarbonate, sodium bicarbonate, lithium bicarbonate and mixtures thereof.

Also suitable are the alkali metal ortho or complex phosphates. The complex phosphates are especially effective because of their ability to chelate water hardness and heavy metal ions. The complex phosphates include sodium or potassium pyrophosphate, tripolyphosphate and hexametaphosphates. Also suitable are the alkali metal borates, acetate, citrates, tartrates, succinates, silicates and phosphonates.

Generally, the powdered flux removing compositions of the invention will contain the alkaline salts in amounts of from about 70 to more than 99% by weight. As set forth above, alkaline salts are utilized alone or in combinations and in concentrations such that the resultant aqueous solutions have a pH of from about 10, or somewhat less, to 13, preferably from about 10 to less than 12, and, most preferably from 10.5-10.9. The desired pH of the cleaning solution may depend on the type of flux beng removed. Thus, the lower pH range is desirable and effective for removing the more easily removed fluxes. However, a pH of above 11.5 is preferred when removing the more difficult to remove solder paste fluxes. Preferably, the powdered compositions when in solution in the wash bath have an adequate reserve of titratable alkalinity, as least equivalent to from about 0.2 to 4.5 percent caustic potash (potassium hydroxide), when titrated to the colorless phenolphthalein end point, which is at about pH 8.4.

The flux removing compositions of the invention should also contain one or more corrosion inhibitors to prevent corrosion or pitting of the connecting tabs or solder joints, metals or other materials present on the circuit boards being cleaned. Preferably, the corrosion inhibitor is an alkali metal silicate salt with the sodium and potassium silicate salts being most preferred. The alkali metal silicates which are used can be in a variety of forms which can be encompassed generally by the formula [Alk]$_2$O:SiO$_2$ wherein [Alk] represents the alkali metal and in which the ratio of the two oxides can vary. Most useful alkali metal silicates will have an [Alk]$_2$O to SiO$_2$ mole ratio of between 1:0.5 and 1:4.5. Most preferably, the [Alk]$_2$O to SiO$_2$ ratio is between 1:1.6 and 1:4.0. Such silicates provide additional alkalinity to the wash water to help cleaning. Surprisingly, it has been found that the addition of silicate actually promotes the brightness and shininess of the solder joints. However, other corrosion inhibitors could be used. For sufficient corrosion protection, it is useful to add 0.1 to 10 wt. % of the corrosion inhibitor based on the amount of powdered cleaning composition.

At least one antifoam agent an be included in any of the flux removing products of this invention. The antifoam agent is utilized to prevent the formation of excessive foam caused by the rosin flux/flux removing combination. Foam will interfere with the mechanical action of the cleaning equipment used to wash the circuit boards. It is important, if not critical, that the antifoam agent used herein does not act by replacing the flux film with another residual surface film which could affect the performance of the electronic circuit board in used. The antifoam agent could be an agent which solely acts to inhibit foam or it could be a surfactant which helps clean the boards and emulsify soils.

Preferred examples of antifoam agents include compounds formed by condensing ethylene oxide with a hydrophobic base formed by the condensation of propylene oxide with propylene glycol. The hydrophobic portion of the molecule which exhibits water insolubility has a molecular weight of from about 1,500 to 1,800. The addition of polyoxyethylene radicals to this hydrophobic portion tends to increase the water solubility of the molecule as a whole and the liquid character of the product is retained up to the point where polyoxyethylene content is about 50 percent of the total weight of the condensation product. Examples of such compositions are the "Pluronics" sold by BASF — Wyandotte.

Other suitable antifoam agents that also enhance flux removal include: the polyethylene oxide/polypropylene oxide condensates of alkyl phenols, e.g., the condensation products of alkyl phenols having an alkyl group containing from about 6 to 12 carbon atoms in either a straight chain or branched chain configuration, with ethylene oxide/propylene oxide, the ethylene oxide being present in amounts equal to 1 to 25 moles of ethylene oxide per mole of alkyl phenol and the propylene oxide being present in amounts equal to 1 to 25 moles of propylene oxide per mole of alkyl phenol. The alkyl substituent in such compounds may be derived from polymerized propylene, diisobutylene, octene, or nonene, for example.

Also suitable are those derived from the condensation of ethylene oxide with the product resulting from the reaction of propylene oxide and ethylene-diamine or from the product of the reaction of a fatty acid with sugar, starch or cellulose. For example, compounds containing from about 40 percent to about 80 percent polyoxyethylene by weight and having a molecular weight of from about 5,000 to about 11,000 resulting from the reaction of ethylene oxide groups with a hydrophobic base constituted of the reaction product of ethylene diamine and excess propylene oxide, and hydrophobic bases having a molecular weight of the order of 2,500 to 3,000 are satisfactory.

In addition, the condensation product of aliphatic alcohols having from 8 to 18 carbon atoms, in either straight chain or branched chain configuration, with ethylene oxide and propylene oxide, e.g., a coconut alcohol—ethylene oxide propylene oxide condensate having from 1 to 30 moles of ethylene oxide per mole of coconut alcohol, and 1 to 30 moles of propylene oxide per mole of coconut alcohol, the coconut alcohol fraction having from 10 to 14 carbon atoms, may also be employed.

The antifoam agents of the present invention are preferably employed in the flux removing compositions at about 0.01 to about 10 wt. % and in the flux removing solution in amounts of up to about 0.1 percent by weight, preferably, about 0.01 to 0.05 percent by weight based on the total weight of the aqueous flux removing solution. The antifoam agents thus, can be included in the dry flux removing compositions, or added separately to the aqueous solution so as to result in the desired concentrations during use.

The present invention also contemplates the use of one more surfactants in the flux removing solutions in order to enhance the wetting and emulsifying ability of the flux remover and permit maximum penetration thereof within regions of the circuit boards most difficult to clean. The surfactant used could be the same agent used to control the foam. Suitable surfactants include anionic, nonionic, cationic surfactants or amphoteric surfactants or combinations thereof. The surfactants should be soluble, stable and, preferably, nonfoaming in use. A combination of surfactants may be employed. The term "surfactant", as used herein, may include other forms of dispersing agents or aids.

It has been found especially effective to use alkoxylated alcohols which are sold under the tradename of "Polytergent SL-Series" surfactants by Olin Corporation. Also, the polycarboxylated ethylene oxide condensates of fatty alcohols manufactured by Olin under the tradename of "Polytergent CS-1" have also been found effective, especially in combination with the above Polytergent SL-Series surfactants. An effective surfactant which also provides antifoam properties is "Polytergent SLF-18" also manufactured by Olin. A combination of this surfactant together with the above two surfactants has been found to provide excellent cleaning with low foam.

Examples of other suitable surfactants are the block copolymers of ethylene oxide and propylene oxide such as those supplied by the BASF Corporation as Pluronics.

Ethoxylated alcohols with 8 to 20 carbons, such as those containing from 3 to 30 moles of ethylene oxide per mole of alcohol could be used as surfactants in this invention. The monocarboxylated derivatives of these surfactants could also be used.

Sodium or potassium salts of sulfonated benzene or naphthalene derivatives such as alkyl benzene sulfonate, or alkyl naphthalene sulfonate or disulfonate could be used. However, caution would have to be employed since these surfactants might tend to impart excessive uncontrollable foam to the wash water.

The amounts of surfactant utilized is usually small, e.g., from less than 0.01% in the wash bath, but will vary depending on the conditions and the contamination encountered and higher surfactant levels may be employed if so desired.

The powdered flux removing compositions of the invention may be produced by any suitable processing technology. Most simply the dry ingredients can be blended in a ribbon or V-shell blender while the liquid ingredients, such as the surfactants, are sprayed on. Alternatively, the ingredients can be agglomerated or spray dried. An advantage of the latter methods is the production of uniform products with less tendency to segregate.

The flux removing solutions which are employed in the cleaning procedures described herein usually contain from about 0.1 to 15, or more, percent, preferably, from about 0.6 to 15 percent and, more preferably, from about 1 to 3 percent by weight of the powdered flux removing compositions of this invention with the balance being essentially water. The upper limit of concentration of the flux removing composition is not critical and is determined by fabrication conditions, the amount of residues and the difficulty of removing same from the circuit assemblies, etc.

The compositions of this invention are characterized by low environmental impact, unlike the chlorinated hydrocarbon solvents and other materials that had been used prior to this invention for printed circuit board cleaning. For example, the alkali metal carbonate and bicarbonate salts are naturally occurring and environmentally benign. The flux removing compositions of the invention have biological oxygen demand (BOD) and chemical oxygen demand (COD) values which are much lower than alternative compositions currently available. By eliminating the need for organic stabilizers typically utilized in aqueous concentrates for handling, storage, and marketing, the compositions of this invention, and, in particular, the methods of use whereby the cleaning compositions are added directly to the wash water in the form of a powder, provide (BOD) and (COD) levels in the aqueous effluents which are drastically reduced from currently available compositions. As described in the Examples herein, the flux removing compositions result in very low BODs and CODs in the rinse water allowing the rinse water to be sewered without further treatment. In comparison, terpenes, e.g., limonene, result in rinse water having BODs and CODs which may require removal before sewering.

The applicability of the compositions of the invention to various aspects of the printed circuit/wiring board fabrication process can best be understood by a description of a representative assembly process.

The assembly manufacturing process involves the placement of components such as integrated circuits, resistors, capacitors, diodes, etc. on the surface of the board or their insertion through pre-drilled holes. The components are then secured by soldering by mechanical or automatic means. Interspersed with the soldering operations are cleaning procedures and inspections to ensure that tape and solder flux residues than could lead to premature circuit failure do not remain.

For the removal of rosin soldering flux deposits and other residues during printed circuit/wiring board fabrication, the compositions of the invention may be applied to the boards by immersion in dip tanks or by hand or mechanical brushing. Alternatively, they may be applied by any of the commercially available printed wiring board cleaning equipment. Dishwasher size units may be employed, or much larger cleaning systems such as the "Poly-Clean +" and the various "Hydro-Station" models produced by Hollis Automation, Inc. of Nashua, New Hampshire. Other examples of cleaning equipment which can be utilized are described in *Cleaning Printed Wiring Assemblies*, Van Nostrand-Reinhold 1991, pp. 120–150.

Depending upon their design, these washers may apply the flux removing compositions of the invention by spraying with mechanical nozzles or by rolling contact with wetted roller surfaces. The temperature at which the compositions may be applied can range from room, or ambient, temperature (about 70° F.) to about 180° F., preferably, about 140° to 170° F. The flux removing compositions are diluted with water to from as low as about 0.1 percent by weight (or volume) concentration and up to about 15 percent by weight.

Regardless of whether the cleaning equipment used is a bath, spray nozzles, brush or roller applicator, the cleaning composition is added directly to the water being supplied to the equipment. Thus, the alkaline salts in powdered form, with or without the adjuvants are added to and dispersed directly into the supply water. Adjuvants such as corrosion inhibitors, antifoam agents, surfactants, and the like may be coated on the powdered alkaline salts, mixed therein if in solid form or such adjuvants may be directly added to the wash water supply separately.

Once solder flux has been loosened and removed during a period of contact which typically ranges from about 1 to about 5 minutes, but may be longer, up to 10 minutes, the boards are taken from the flux removing solution. Another advantage of the instant invention is that the flux removing solutions need not be flushed with solvents as with the processes of the prior art. Herein, the boards may simply be flushed with water for a period of up to about 2 minutes. Deionized water is preferred. The optimal rinsing time varies according to the kinds of surfactants and the concentrations of the flux removing solutions used and can easily be determined by routine experimentation.

The cleaned boards are then dried, preferably with forced air. Drying is expedited if the air is warmed, preferably to above about 100° F.

The efficacy of rosin soldering flux removal from printed wiring boards is such that the boards meet stringent military specifications for low resistivity after cleaning. For example, the boards meet the Mil-P-28809A standard for low resistivity of the solvent extracts resulting when the contamination has been removed from a circuit board cleaned according to Mil-P-55110C. The resistivity of such solvent extracts after the cleaning of the boards is complete is most easily determined with an Omega Meter. Omega Meter is the registered trademark of Kenco Industries, Inc., Atlanta, Ga., for a microprocessor-controlled contamination test system that rapidly measures changes in resistivity due to contaminating ions.

The results of Omega Meter measurements are expressed in equivalent units of ug $NaCl/in^2$ or its metric equivalent. According to MIL-P-28809A, the acceptable resistivity value for a cleaned board is equivalent to 2.2. ug $NaCl/cm^2$ or 14 ug $NaCl/in^2$, but far better results are routinely obtained after solder flux has been removed with the flux removing solutions of the present invention. A value of about 0.31 ug $NaCl/cm^2$, or 2.0 ug $NaCl/in^2$, or even less, is typical.

The flux removing solutions of this invention are also effective in removing other undesirable and deleterious substances and residues. One particularly troublesome substance is the residue left by adhesive tape used during fabrication of the electronic circuit assemblies.

During the process of gold plating connecting tabs to improve corrosion resistance, tin-lead residues must first be removed from the unplated tabs. Removal of these residues is carried out through the use of etching chemicals that can damage other unprotected printed circuit/wiring board components. To protect vulnerable components from the etching chemicals, boards are wrapped on both sides with an adhesive plating tape which forms a shield or splash guard for all but the exposed tab area. The etching chemicals then remove the tin-lead residues on the tabs, a nickel plate is applied as a base for the gold, and gold plating of the tabs is finally carried out. The adhesive plating tape which is maintained in place through all of these etching and plating steps, is then removed. When the tape is removed following the nickel and gold plate step, it is at this point that the cleaning compositions of the invention may most advantageously be used.

Thus, following removal of the tape, a silicone-based and/or rubber-based adhesive residue may remain on the board. This residue may easily be removed by employing the compositions of the invention under the same conditions described above for solder flux removal. The exact operational parameters will be determined by the nature of the adhesive residue and the tenacity with which it adheres to the board, but the conditions described above are generally effective. As in the case of solder flux removal, treatment of the board with the flux removing solutions of the invention is generally followed by water flushing and air drying.

The efficiency of removal of adhesive residues from printed circuit/wiring boards by the compositions of the invention is such that no residues are visible after cleaning. A simple 5-10× stereomicroscope can facilitate visual inspection for tape residues following cleaning.

EXAMPLES 1-4

The following examples illustrate useful powdered compositions which can be utilized in any of the known ECA cleaning methods and apparatus. The individual ingredients of the useful compositions are set forth in Table I below. All compositions are formulated by spraying liquid ingredients onto the solid carbonate and bicarbonate or phosphate powders or by spray drying the ingredients to uniform powders. Table I also includes the suggested usage concentrations of each composition in the wash bath.

TABLE I

|  | Examples | | | |
|---|---|---|---|---|
|  | 1 | 2 | 3 | 4 |
| Potassium Carbonate | 70.6 | 36.0 | 0.0 | 30.0 |
| Sodium carbonate | 12.0 | 50.0 | 31.0 | 55.0 |
| Sodium bicarbonate | 12.0 | 5.0 | 0.0 | 0.0 |
| Sodium tripolyphosphate | 0.0 | 0.0 | 35.0 | 0.0 |
| Trisodium phosphate | 0.0 | 0.0 | 15.0 | 0.0 |
| Sodium silicate (2.4 $SiO_2:Na_2O$) | 2.0 | 6.0 | 15.0 | 6.0 |
| Sodium metasilicate | 0.0 | 0.0 | 0.0 | 4.0 |
| Polytergent CS-1 | 0.8 | 0.0 | 1.0 | 1.0 |
| Polytergent SL-62 | 2.0 | 0.0 | 1.0 | 2.0 |
| Polytergent SLF-18 | 0.6 | 0.0 | 1.0 | 2.0 |
| Pluronic 25R2 | 0.0 | 0.5 | 0.5 | 0.0 |
| Plurafac RA30 | 0.0 | 0.5 | 0.5 | 0.0 |
| Total | 100.0 | 100.0 | 100.0 | 100.0 |
| Suggested Usage Concentration | 1-3% | 2-6% | 0.6-2% | 1-3% |

Polytergent is a tradename of Olin Corporation.
CS-1 is a carboxylated, ethoxylated fatty alcohol mixture,
SL-62 and SLF-18 are alkoxylated fatty alcohol mixtures.
Pluronic 25R2 is a tradename of BASF Wyandotte and consists of a block copolymer of ethylene oxide and propylene oxide.
Plurafac RA30 is a tradename of BASF Wyandotte and consists of an alkoxylated surfactant alcohol.

EXAMPLE 5

The powdered composition of Example 1 is utilized to clean test wiring boards using a "Polyclean +" machine manufactured by Hollis Automation, Inc., of Nashua, New Hampshire.

The cleaning sequence comprises the operations of loading, washing, drying, first rinsing, final rinsing and high speed drying carried out in succession. The washing operation utilizing cleaning solutions of the invention is done in two stages, i.e., a first regular wash with a spray nozzle manifold which directs a regular wash spray at 40 psig followed by a "hurricane" spray at 80 psig. The cleaning solutions are maintained at 160° F. The rinses are also two stage operations; the first at 40 psig regular rinse followed by an 80 psig "hurricane" rinse with the rinse water having a temperature of 160° F. A final rinse is effected under substantially the same conditions. The circuit boards are subjected to Alpha air knife drying after the washing and final rinse stages.

In air knife drying, turbine propelled air shears fluids from the boards' surfaces.

Cleaned and dried boards are evaluated for cleaning efficiency visually.

The visual test method uses a dyed flux and carrier base injected between glass components and a glass board. This provides excellent access for visual inspection. The analysis is further quantified by placing the board and components against a grid. Each block of the grid is then read as being completely clean or containing residue.

The test method utilizes straight flux and carrier from a rosin mildly activated (RMA) flux or paste. It is essentially the solder paste minus the solder. "Carrier" refers to both the flux paste and all other additives included in solder paste, except the solder. This carrier is then injected with red dye so that visual examination can be made more rapidly. The dye does not affect the carrier density or melting properties. The dyed carrier is then injected under the glass components on specially made test boards. RMA solder paste is not considered an aqueous-compatible flux. The test boards are constructed of glass. A 1"×1" square coupon that simulates the component is mounted onto a glass substrate. The coupon is glued in place by first laying shim stock of the desired standoff height on the glass. Next, the glue is applied and the coupon set in place until it dries. When dry, the shim stock is removed. Six coupons are mounted on a single board at ½" spacing. The interior coupons are further shielded from any nozzles by the first coupons in the placement array.

The flux carrier stock is injected under each coupon to entirely fill the inch-square area. Flux is also added to the area surrounding each coupon. The board is IR-reflowed at a typical dwell time of five minutes at reflow temperature. All boards are then stored for 24 hours at ambient temperature prior to cleaning. Reflowing and storing increases cleaning difficulty by allowing the board to cool and the flux carrier to set up.

Prior to reflow, the entire area under the coupon is filled with the dyed flux carrier. During reflow, a small percentage of the area under the coupon develops voids due to expansion and escape of flux volatiles. The area under the coupons filled with baked-on residue is measured prior to cleaning. The application method causes most of the flux to be bridged across the component standoff height. These regions entirely filled with flux are the most difficult to clean. They are also much less likely to occur in actual manufacturing processes since much less flux is applied. For the purposes of this test, however, no special measurement qualification is given to this category. By regarding all areas with flux trapped under them as the same, the test method is made more rigorous. This method is directed toward the measurement of cleaning effectiveness, which is defined as the percentage of residue removed. This aqueous cleaning test method is described more fully in a publication by Janet R. Sterritt, "Aqueous Cleaning Power," *Printed Circuit Assembly*, Sept. 1989, pp. 26–29.

The Polyclean+ machine is operated so that all wash water for the two-stage nozzle spray during cleaning comes from a supply which includes the composition of Example 1. The composition is added as a powder directly to the water supply so as to provide a concentration of 1.5 weight percent of the composition in the wash water. The sequence of the machine is then initiated. The wash cycle time is 1.5 minutes with a wash water temperature of 160° F.

Visual evaluation of the board by grid analysis shows that over 97 percent of the flux is removed.

EXAMPLE 6

The following example illustrates the improved environmental impact the powdered cleaning compositions of the present invention provide relative to present commercial cleaning formulations. Thus, the composition of Example 2 above is added to a wash solution at a concentration of 2 wt. %. At this concentration, it is calculated that only about 400 ppm of COD is added to the wash water. In comparison, a typical commercial aqueous flux removing composition adds 100,000–500,000 ppm of COD to the wash water. It can be seen that by eliminating the need for organic stabilizers, the COD of the wash water and consequently wash effluents can be drastically reduced utilizing the powdered compositions of this invention.

EXAMPLE 7

Similar to Example 6, the composition as set forth in Example 4 above is added to a wash solution at a concentration of 3 wt. %. Example 4 has a higher concentration of surfactants than the other examples set forth in Table 1. At the concentration designated, Example 4 is calculated to add 3,500 ppm of COD to the wash water. As can be seen, this compares most favorably to the presently available commercial flux removing compositions.

What is claimed is:

1. A method of removing soldering flux alone or with other residues from a printed wiring board, comprising
   (a) providing a supply of water to a cleaning apparatus wherein said water supply is contacted with said wiring board;
   (b) directly adding to said water supply a cleaning composition in powdered form comprising water soluble alkaline salts to form a cleaning solution;
   (c) contacting the board with said aqueous cleaning solution; and
   (d) removing the combined composition and soldering flux or other residues from the board.

2. The method of claim 1 wherein said aqueous cleaning solution has a pH of from about 10 to 13.

3. The method of claim 2 wherein said aqueous cleaning solution has a pH of from about 10 to less than 12.

4. The method of claim 1 wherein said aqueous cleaning solution contains from about 0.1 to 15 wt. % of said cleaning composition.

5. The method of claim 1 wherein at least one adjuvant selected from an anticorrosion agent, antifoaming agent, surfactant and mixtures thereof is added to the aqueous cleaning solution.

6. The method of claim 5 wherein said adjuvant is contained in said powdered composition.

7. The method of claim 6 wherein said adjuvant is coated onto the powdered alkaline salts.

8. The method of claim 7 wherein said adjuvant is liquid and sprayed onto the powdered alkaline salts.

9. The method of claim 1 wherein said cleaning solution contains from about 0.6 to 15% by weight of the cleaning composition.

10. The method of claim 1 wherein said contact is carried out at a temperature of from room temperature to about 180° F.

11. The method of claim 10 wherein said contact is carried out for a period of from 1 to 10 minutes.

12. The method of claim 6 wherein said adjuvant is in powdered form.

13. The method of claim 12 wherein said adjuvant is agglomerated with powders of said alkaline salts.

14. The method of claim 1 wherein said cleaning composition is formed by spray drying the components into powdered form.

15. The method of claim 5 wherein said adjuvant includes an anticorrosion agent.

16. The method of claim 15 wherein said anticorrosion agent is an alkali metal silicate characterized by an $Alk_2O$ to $SiO_2$ mole ratio of between 1:0.5 to 1:4.5, wherein Alk represents an alkali metal.

17. The method of claim 16 wherein said alkali metal silicate is sodium or potassium silicate.

18. The method of claim 15 wherein said anticorrosion agent is potassium silicate.

19. The method of claim 1 wherein said cleaning solution is contacted with the boards in the form of a spray.

20. The method of claim 1 wherein said cleaning solution is contacted with said boards in the form of a bath in which said boards are immersed.

21. The method of claim 1 wherein said aqueous cleaning solution contains from about 0.1–15 wt. % of said cleaning composition, said cleaning solution having a pH of from about 10 to 13 and wherein said alkaline salts are so combined so as to provide said cleaning solution with a reserve of titratable alkalinity at least equivalent to from about 0.2 to 4.5% caustic potash when titrated to the colorless phenolphthalein endpoint of about pH 8.4.

22. The method of claim 21 wherein at least one adjuvant selected from an anticorrosion agent, antifoaming agent, surfactant and mixtures thereof is added to the aqueous cleaning solution.

23. The method of claim 22 wherein said adjuvant is contained in said powdered composition.

24. The method of claim 23 wherein said adjuvant is coated onto the powdered alkaline salts.

25. The method of claim 24 wherein said adjuvant is liquid and sprayed onto the powdered alkaline salts.

26. The method of claim 22 wherein said adjuvant is in powdered form.

27. The method of claim 25 wherein said adjuvant is agglomerated with powders of said alkaline salts.

28. The method of claim 22 wherein said adjuvant includes an alkali metal silicate anticorrosion agent.

29. The method of claim 28 wherein said anticorrosion agent is potassium silicate.

* * * * *